(12) United States Patent
Chen et al.

(10) Patent No.: US 9,711,403 B2
(45) Date of Patent: Jul. 18, 2017

(54) METHOD FOR FORMING CHIP PACKAGE

(75) Inventors: Chien-Hui Chen, Zhongli (TW);
Ming-Kun Yang, Pingzhen (TW);
Tsang-Yu Liu, Zhubei (TW); Yen-Shih Ho, Kaohsiung (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 13/352,234

(22) Filed: Jan. 17, 2012

(65) Prior Publication Data

US 2012/0184070 A1    Jul. 19, 2012

Related U.S. Application Data

(60) Provisional application No. 61/433,381, filed on Jan. 17, 2011.

(51) Int. Cl.
*H01L 21/78* (2006.01)
*H01L 21/768* (2006.01)
(Continued)

(52) U.S. Cl.
CPC .... *H01L 21/76898* (2013.01); *H01L 23/3114* (2013.01); *H01L 23/481* (2013.01); *H01L 24/03* (2013.01); *H01L 24/05* (2013.01); *H01L 23/3121* (2013.01); *H01L 24/13* (2013.01); *H01L 2224/02372* (2013.01); *H01L 2224/0401* (2013.01); *H01L 2224/05548* (2013.01); *H01L 2224/131* (2013.01);
(Continued)

(58) Field of Classification Search
USPC ........ 438/114, 113, 461, 458, 459, 462–465, 438/612, 620, 622–629, 636–640, 438/642–644, 652–654, 666–669, 438/672–673, 675, 700–701, 713–714; 257/678, 738, 758, 774, 776, 780, 257/E21.159, E21.509, E21.578, E21.597, 257/E23.011, E23.021, E23.067, E23.174
See application file for complete search history.

(56) References Cited

U.S. PATENT DOCUMENTS 5,122,856 A * 6/1992 Komiya ............................ 257/774
5,705,838 A * 1/1998 Jost et al. ........................ 257/296
(Continued)

FOREIGN PATENT DOCUMENTS

JP    2005-260079    9/2005

*Primary Examiner* — Ori Nadav
*Assistant Examiner* — Ernest Allen, III
(74) *Attorney, Agent, or Firm* — Liu & Liu

(57) ABSTRACT

An embodiment of the invention provides a method for forming a chip package which includes: providing a substrate having a first surface and a second surface, wherein at least two conducting pads are disposed on the first surface of the substrate; partially removing the substrate from the second surface of the substrate to form at least two holes extending towards the first surface, wherein the holes correspondingly and respectively align with one of the conducting pads; after the holes are formed, partially removing the substrate from the second substrate to form at least a recess extending towards the first surface, wherein the recess overlaps with the holes; forming an insulating layer on a sidewall and a bottom of the trench and on sidewalls of the holes; and forming a conducting layer on the insulating layer, wherein the conducting layer electrically contacts with one of the conducting pads.

20 Claims, 12 Drawing Sheets

(51) Int. Cl.
*H01L 23/48* (2006.01)
*H01L 23/31* (2006.01)
*H01L 23/00* (2006.01)

(52) U.S. Cl.
CPC .............. *H01L 2224/13022* (2013.01); *H01L 2224/13024* (2013.01); *H01L 2224/73253* (2013.01); *H01L 2924/12041* (2013.01); *H01L 2924/14* (2013.01); *H01L 2924/1461* (2013.01); *H01L 2924/15788* (2013.01)

(56) References Cited

U.S. PATENT DOCUMENTS

| | | | |
|---|---|---|---|
| 5,854,140 A * | 12/1998 | Jaso et al. | 438/740 |
| 5,985,762 A * | 11/1999 | Geffken | H01L 21/76801 257/E21.576 |
| 6,080,655 A * | 6/2000 | Givens et al. | 438/626 |
| 6,184,138 B1 * | 2/2001 | Ho | H01L 21/7684 257/E21.583 |
| 6,251,774 B1 * | 6/2001 | Harada et al. | 438/637 |
| 6,482,733 B2 * | 11/2002 | Raaijmakers et al. | 438/633 |
| 7,622,810 B2 * | 11/2009 | Takao | 257/774 |
| 7,855,342 B2 * | 12/2010 | Sakamoto et al. | 174/260 |
| 7,986,021 B2 * | 7/2011 | Okada et al. | 257/436 |
| 8,278,213 B2 * | 10/2012 | Kameyama et al. | 438/667 |
| 2002/0047210 A1 * | 4/2002 | Yamada et al. | 257/774 |
| 2004/0137701 A1 * | 7/2004 | Takao | 438/461 |
| 2005/0003649 A1 * | 1/2005 | Takao | 438/612 |
| 2005/0194670 A1 * | 9/2005 | Kameyama | H01L 21/76898 257/678 |
| 2006/0079019 A1 * | 4/2006 | Kim | H01L 23/3114 438/106 |
| 2006/0094158 A1 * | 5/2006 | Lee et al. | 438/106 |
| 2007/0126121 A1 * | 6/2007 | Shue | H01L 21/76804 257/774 |
| 2007/0164443 A1 * | 7/2007 | Florian | H01L 21/743 257/774 |
| 2008/0230860 A1 * | 9/2008 | Yen et al. | 257/433 |
| 2009/0050995 A1 * | 2/2009 | Liu et al. | 257/434 |
| 2009/0283877 A1 * | 11/2009 | Tsai et al. | 257/659 |
| 2009/0289345 A1 * | 11/2009 | Tsai | H01L 21/76898 257/690 |
| 2010/0090304 A1 * | 4/2010 | Liu et al. | 257/432 |
| 2011/0156074 A1 * | 6/2011 | Liu et al. | 257/98 |
| 2011/0169139 A1 * | 7/2011 | Lin et al. | 257/621 |
| 2011/0175236 A1 * | 7/2011 | Lou et al. | 257/774 |
| 2011/0221070 A1 * | 9/2011 | Yen et al. | 257/774 |
| 2011/0233770 A1 * | 9/2011 | Chiu et al. | 257/737 |
| 2011/0278734 A1 * | 11/2011 | Yen et al. | 257/774 |
| 2011/0278735 A1 * | 11/2011 | Yen et al. | 257/774 |
| 2011/0285032 A1 * | 11/2011 | Yen et al. | 257/774 |
| 2012/0181672 A1 * | 7/2012 | Lou et al. | 257/621 |

* cited by examiner

METHOD FOR FORMING CHIP PACKAGE

CROSS REFERENCE TO RELATED APPLICATIONS

This Application claims the benefit of U.S. Provisional Application No. 61/433,381, filed on Jan. 17, 2011, the entirety of which is incorporated by reference herein.

BACKGROUND OF THE INVENTION

Field of the Invention

The invention relates to a chip package, and in particular relates to a chip package having a through substrate conducting structure.

Description of the Related Art

The chip packaging process is an important process when fabricating an electronic product. Chip packages not only provide chips with protection from environmental contaminants, but also provide an interface for connection between electronic elements in the chips and electronic elements outside of the chip package.

As the size of the chip shrinks and the density of interconnections increases, the size and wire density of the chip package also need to be adjusted. It has become an important issue to form a desired conducting route given a limited space, while also maintaining the quality of the formed conducting route.

BRIEF SUMMARY OF THE INVENTION

An embodiment of the invention provides a method for forming a chip package which includes: providing a substrate having a first surface and a second surface, wherein at least two conducting pads are disposed on the first surface of the substrate; partially removing the substrate from the second surface of the substrate to form at least two holes extending towards the first surface, wherein the holes correspondingly and respectively align with one of the conducting pads; after the holes are formed, partially removing the substrate from the second substrate to form at least a recess extending towards the first surface, wherein the recess overlaps with the holes; forming an insulating layer on a sidewall and a bottom of the trench and on sidewalls of the holes; and forming a conducting layer on the insulating layer, wherein the conducting layer electrically contacts with one of the conducting pads.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a variety of chips. For example, the chip package of the embodiments of the invention may be applied to package active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power IC modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, after the dicing process is performed, the obtained chip package is a chip scale package (CSP). The size of the chip scale package (CSP) may be only slightly larger than the size of the packaged chip. For example, the size of the chip scale package is not larger than 120% of the size of the packaged chip.

Figure 1A:
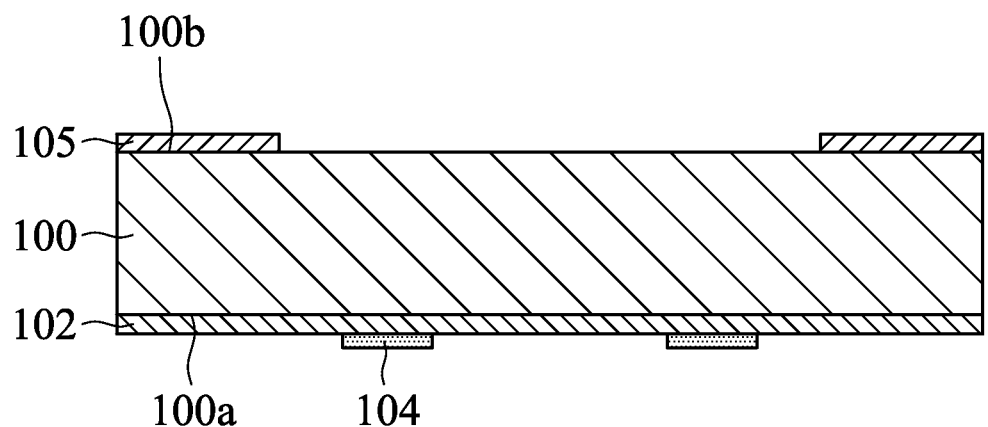
FIGS. 1A-1L are cross-sectional views showing the steps of forming a chip package according to an embodiment of the present invention.

FIGS. 1A-1L are cross-sectional views showing the steps of forming a chip package according to an embodiment of the present invention. As shown in FIG. 1A, a substrate 100 is provided, which has a surface 100a and a surface 100b. The substrate 100 may be a semiconductor substrate such as a semiconductor wafer. At least a device region (not shown) may be formed on the substrate 100. The device region may be electrically connected to a conducting pad 104 on the surface 100a of the substrate 100. The conducting pad 104 may be formed on or in a dielectric layer 102 on the surface 100a. In one embodiment, the conducting pad 104 may be a stacked layer of a plurality of conducting pads.

As shown in FIG. 1A, in order to define a recess in the substrate 100, a patterned mask layer 105 may be formed on the surface 100b of the substrate 100, which has an opening exposing a portion of the substrate 100. The opening may overlap with at least two conducting pads 104 thereunder.

Figure 1B:
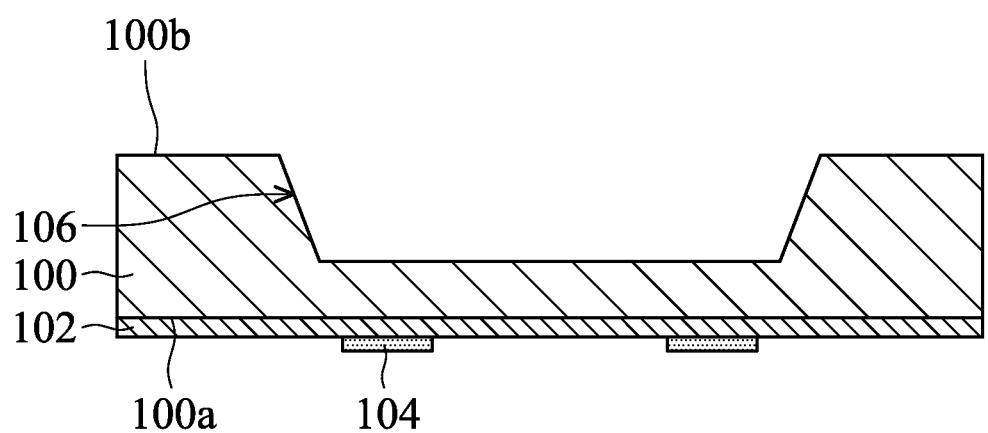

Next, as shown in FIG. 1B, an etching process may, for example, be performed to the surface 100b of the substrate 100 to remove the portion of the substrate 100 not covered by the mask layer 105, thus forming a recess 106 extending from the surface 100b towards the surface 100a of the substrate 100. Then, the mask layer 105 is removed.

Figure 1C:
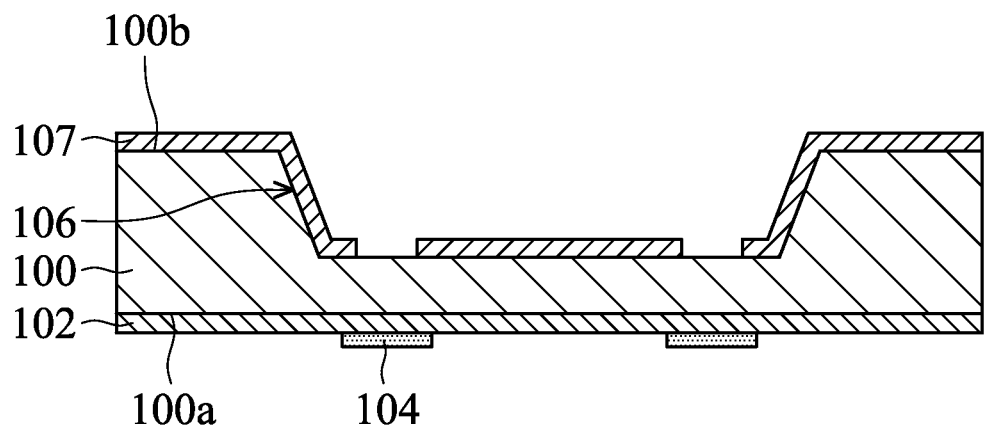

As shown in FIG. 1C, in order to define holes at a bottom of the recess 106 of the substrate 100, a patterned mask layer 107 may be formed on the surface 100b of the substrate 100, which has at least two openings exposing a portion of the substrate 100. The openings may be substantially aligned with corresponding conducting pads 104 thereunder, respectively.

Figure 1D:
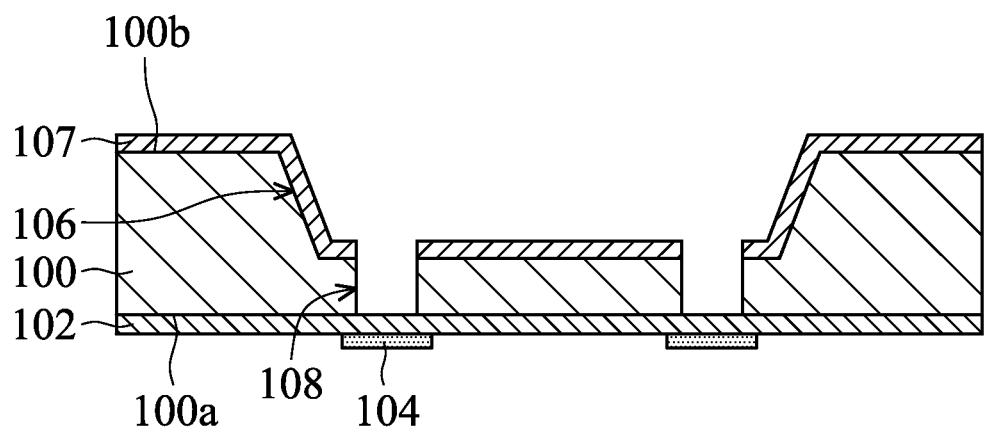

Next, as shown in FIG. 1D, the portion of the substrate 100 not covered by the mask layer 107 may be removed from the bottom of the recess 106 by using, for example, an etching process, thus forming holes 108 extending from the surface 100b towards the surface 100a of the substrate 100. In one embodiment, the holes 108 expose the dielectric layer 102. In one embodiment, the hole 108 substantially aligns with a corresponding conducting pad 104 thereunder.

Figure 1E:
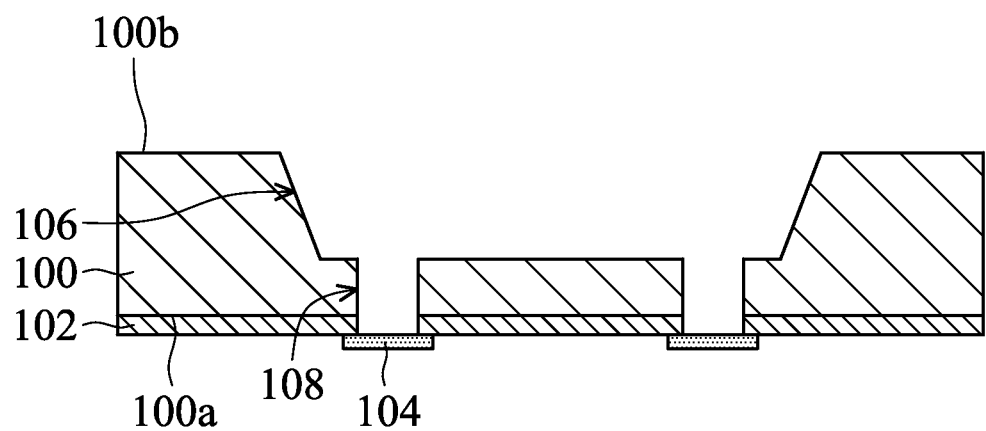

As shown in FIG. 1E, the dielectric layer 102 below the holes 108 may be removed by using, for example, an etching process such that the corresponding conducting pads are exposed. In one embodiment, the etchant used in the etching process for removing the dielectric layer 102 may substantially not etch and remove or only slightly etch and remove the conducting pad 104. Then, the mask layer 107 may be removed.

Figure 1F:
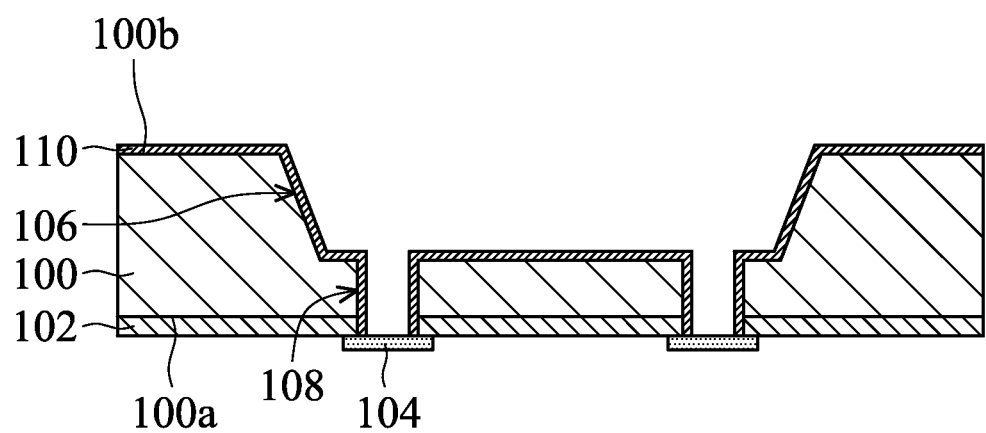

Next, as shown in FIG. 1F, an insulating layer 110 may be formed on the sidewall and the bottom of the recess 106 and the sidewalls of the holes 108. For example, the insulating layer 110 may be conformally formed on the surface 100b of the substrate 100 by using a chemical vapor deposition process. In this embodiment, a through-hole extending from the surface 100b towards the surface 100a of the substrate 100 is together constructed by the recess 106 and the hole 108, thus the through-hole has a smaller aspect ratio which helps for the deposition of the insulating layer 110. In one embodiment, the insulating layer 110 covers the conducting pads 104. In this case, a patterning process may be further performed to remove the insulating layer 110 on the bottom of the hole 108 such that the conducting pads 104 are exposed.

Figure 1G:
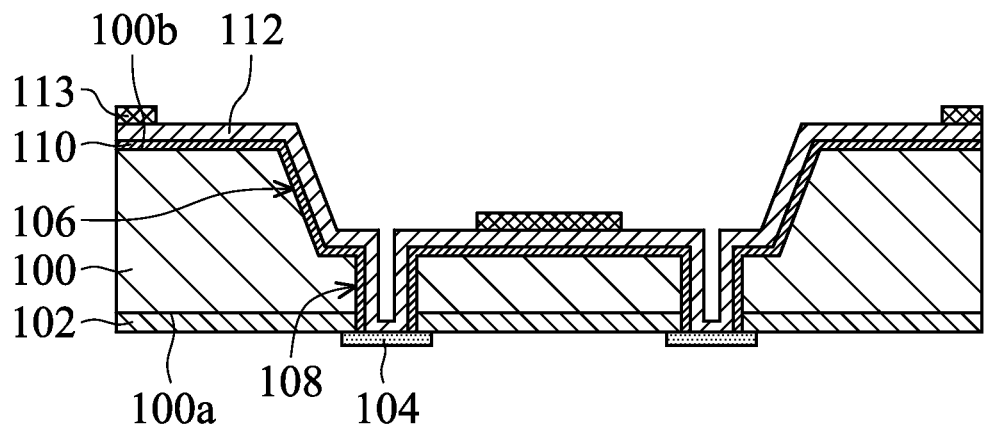

As shown in FIG. 1G, a seed layer 112 may be formed on the surface 100b of the substrate 100 by using, for example, a physical vapor deposition process. In this embodiment, the through-hole extending from the surface 100b towards the surface 100a of the substrate 100 is together constructed by the recess 106 and the hole 108, thus the through-hole has a smaller aspect ratio which helps for the deposition of the seed layer 112. The seed layer 112 may extend onto the sidewall and the bottom of the recess 106 and further extend onto the sidewall and the bottom of the hole 108 to electrically contact with the conducting pad 104. Then, a mask layer 113 may be formed on the seed layer 112.

Figure 1H:
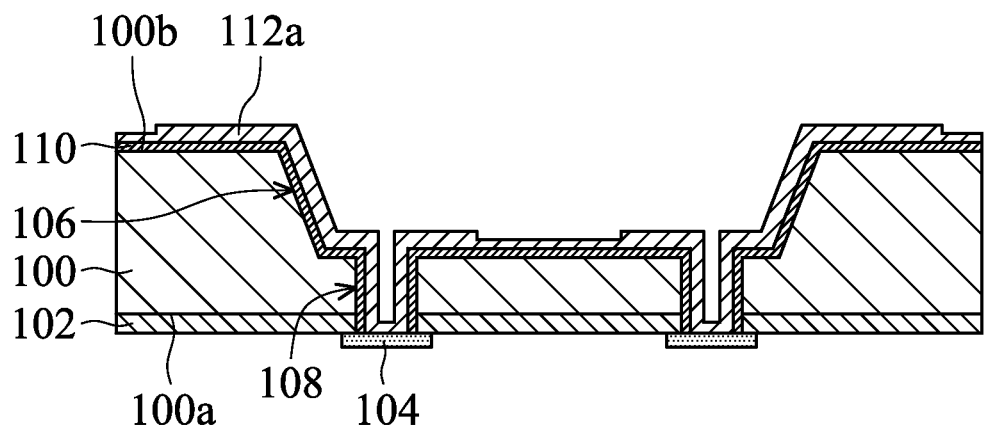

Next, as shown in FIG. 1H, a conducting material may be deposited on the portion of the seed layer 112 not covered by the mask layer 113, by using an etching process and/or an electroless plating process, to form a conducting layer 112a with a larger thickness. Then, the mask layer 113 is removed to expose the seed layer thereunder.

Figure 1I:
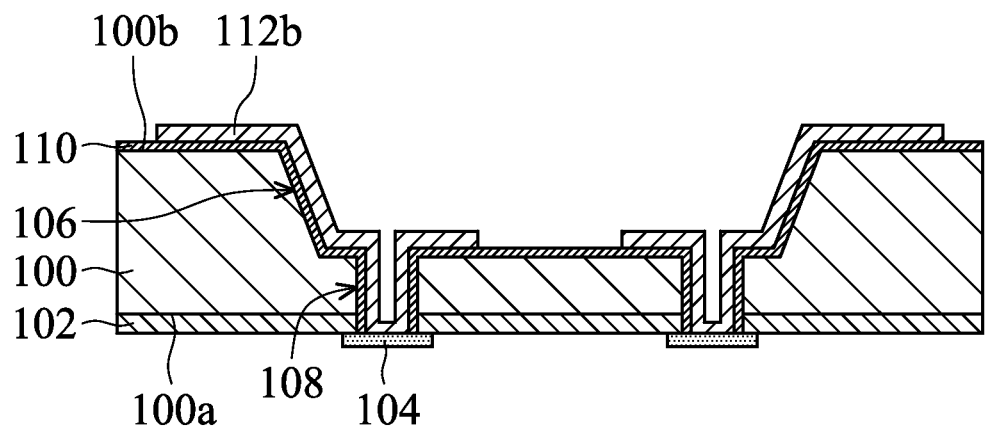

As shown in FIG. 1I, the seed layer originally covered by the mask layer may be removed by using, for example, an etching process such that the conducting layer 112a has a desired pattern. The conducting layer 112a is also slightly removed during the etching process where the seed layer originally covered by the mask layer is removed. Then, a conducting material layer may be deposited on a surface of the conducting layer 112a, by using a chemical nickel-plating process or a chemical gold-plating process, to form a thicker patterned conducting layer 112b, wherein the chemical nickel-plating process or the chemical gold-plating process may improve the reliability of the conducting layer and the bonding with a subsequently formed material layer. It should be appreciated that the descriptions of the process about the formation of the conducting layer are merely examples. The patterned conducting layer 112b is not limited to be formed by the process mentioned above.

Figure 1J:
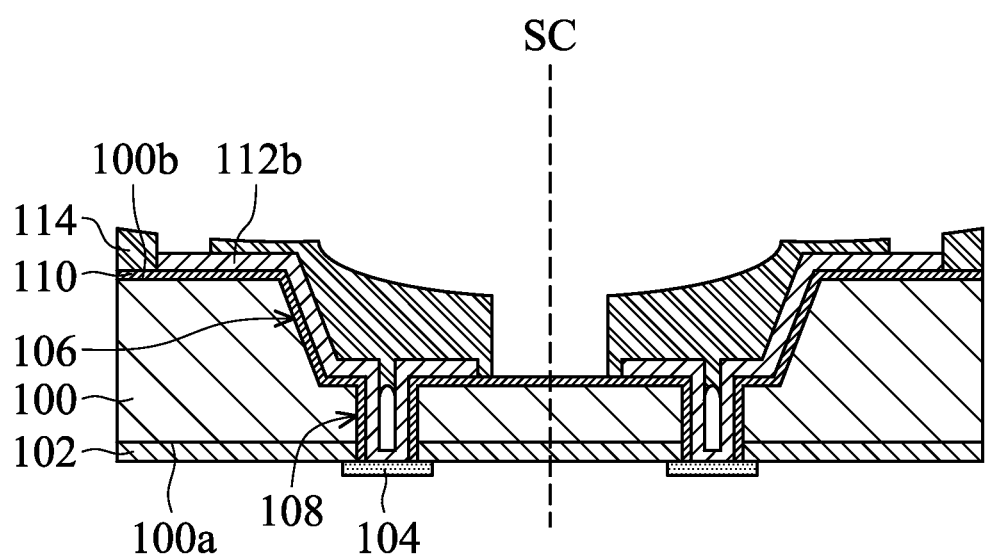

Next, as shown in FIG. 1J, a patterned protection layer 114 is formed on the surface 100b of the substrate 100. The protection layer 114 has at least an opening exposing the conducting layer 112b thereunder. In one embodiment, the protection layer 114 extends into the recess 106. In one embodiment, the protection layer 114 extends into the hole 108. In one embodiment, the protection layer 114 in the recess 106 has a trench which substantially overlaps with the predetermined scribe line SC of the substrate 100.

Figure 1K:
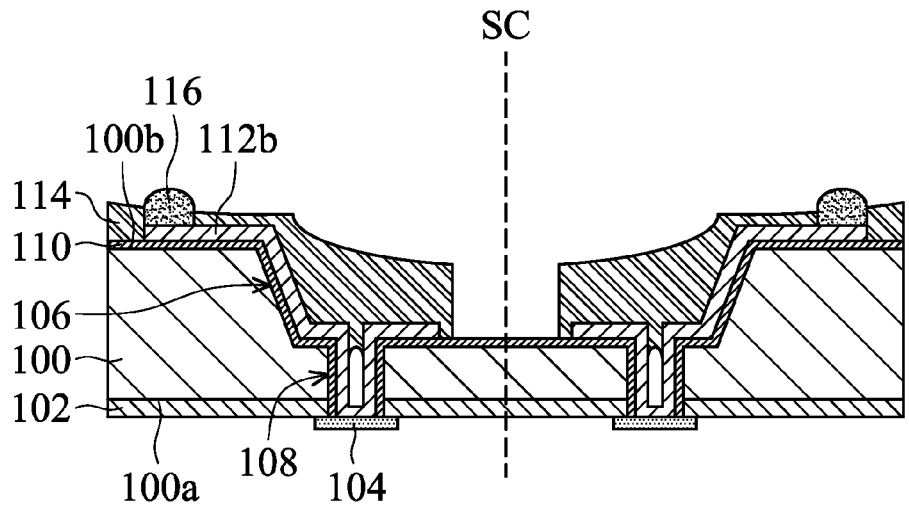

As shown in FIG. 1K, a conducting bump 116 is formed in the opening of the protection layer 114, which exposes the conducting layer 112b.

Figure 1L:
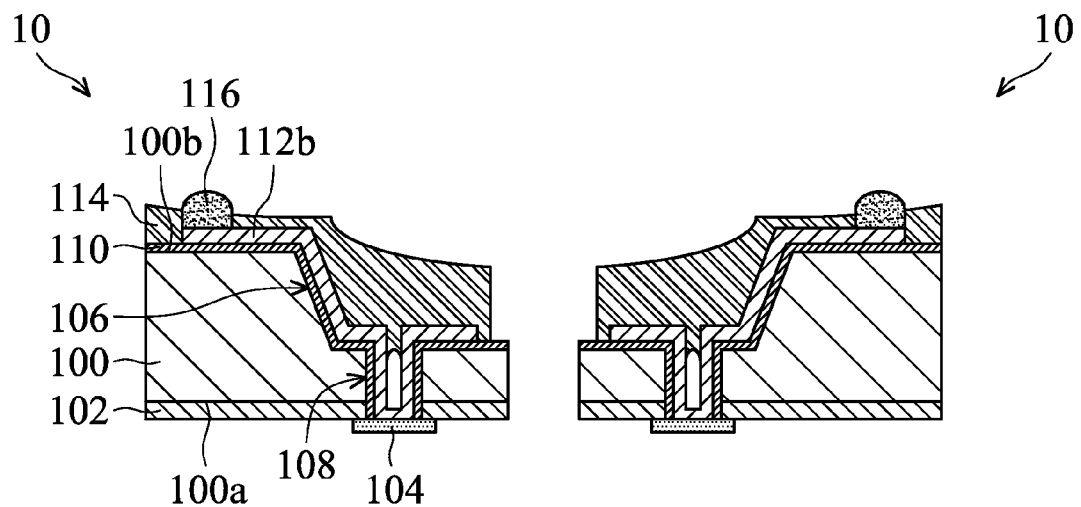

Next, as shown in FIG. 1L, the substrate 100 is diced along the predetermined scribe lines SC of the substrate 100 to form at least an individual chip package 10. Because the protection layer 114 has a trench located at the scribe line, the protection layer 114 is not cut during the dicing process. Thus, the quality of the chip package may be improved. In this case, a sidewall of the protection layer 114 is not coplanar with a sidewall of the substrate 100.

In the above embodiments, the through-hole is formed by forming a recess, followed by forming a hole. However, embodiments of the invention are not limited thereto. For example, FIGS. 2A-2H are cross-sectional views showing the steps of forming a chip package according to another embodiment of the present invention, wherein same or similar reference numbers are used to designate same or similar elements.

Figure 2A:
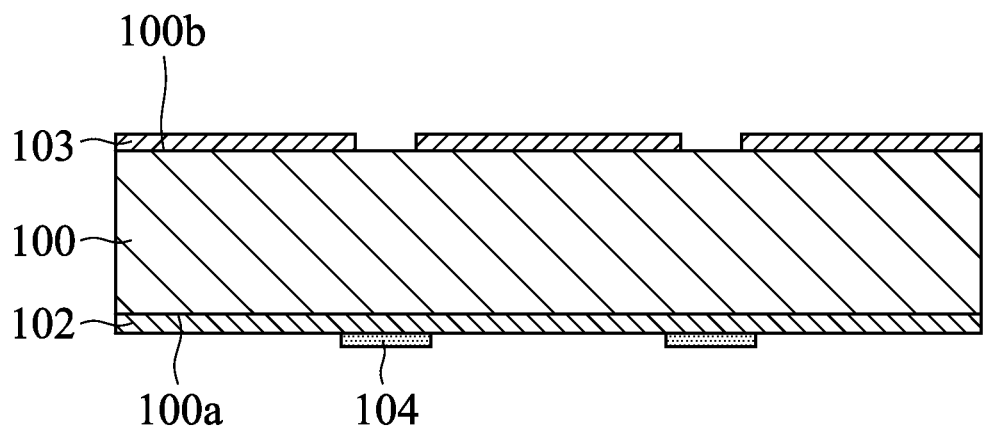
FIGS. 2A-2H are cross-sectional views showing the steps of forming a chip package according to an embodiment of the present invention.

As shown in FIG. 2A, a substrate 100 is provided, which has a surface 100a and a surface 100b. The substrate 100 may be a semiconductor substrate such as a semiconductor wafer. At least a device region (not shown) may be formed on the substrate 100. The device region may be electrically connected to a conducting pad 104 on the surface 100a of the substrate 100. The conducting pad 104 may be formed on or in a dielectric layer 102 on the surface 100a. In one embodiment, the conducting pad 104 may be a stacked layer of a plurality of conducting pads.

As shown in FIG. 1A, in order to define holes in the substrate 100, a patterned mask layer 103 may be formed on the surface 100b of the substrate 100, which has at least two openings exposing a portion of the substrate 100. The openings may substantially align with two corresponding conducting pads 104 thereunder, respectively.

Figure 2B:
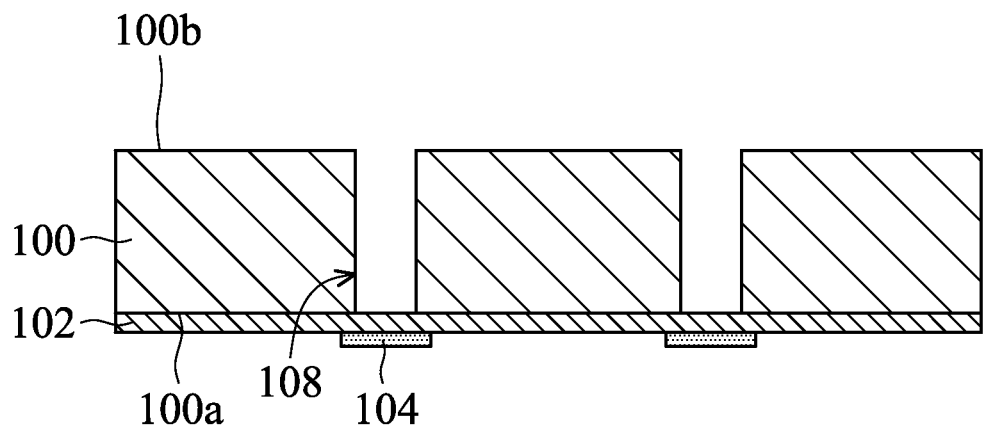

Next, as shown in FIG. 2B, an etching process may, for example, be performed to the surface 100b of the substrate 100 to remove the portion of the substrate 100 not covered by the mask layer 103, thus forming holes 108 extending from the surface 100*b* towards the surface 100*a* of the substrate 100. Then, the mask layer 103 is removed. In one embodiment, the holes 108 expose the dielectric layer 102. In one embodiment, the hole 108 substantially aligns with a corresponding conducting pad 104 thereunder.

Figure 2C:
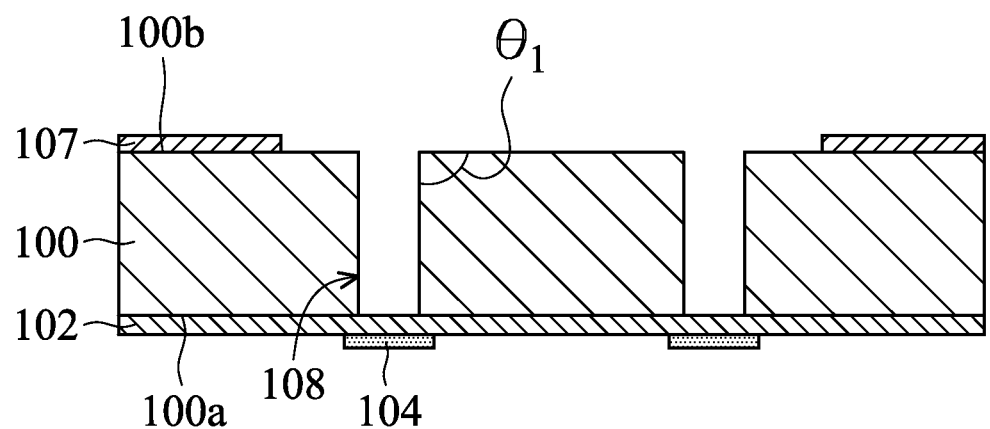

As shown in FIG. 2C, in order to define a recess on the surface 100*b* of the substrate 100, a patterned mask layer 107 may be formed on the surface 100*b* of the substrate 100, which has at least an opening exposing a portion of the substrate 100. The openings may overlap with the at least two conducting pads 104 thereunder.

Figure 2D:
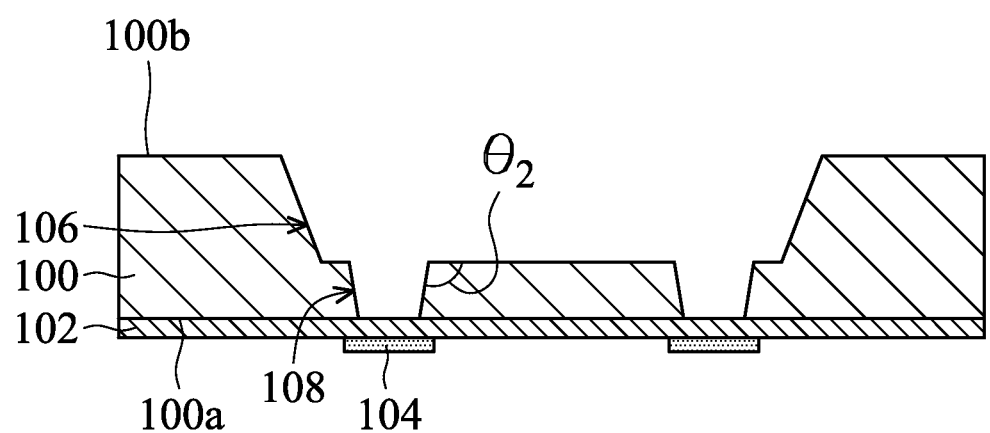

Next, as shown in FIG. 2D, the portion of the substrate 100 not covered by the mask layer 107 may be removed from the surface 100*b* of the substrate 100 by using, for example, an etching process, thus forming a recess 106 extending from the surface 100*b* towards the surface 100*a* of the substrate 100. During the formation of the recess 106, a sidewall of the hole 108 may also be affected. For example, in one embodiment, an inclination degree of the sidewall of the hole 108 with respect to the surface 100*b* may be increased. As shown in FIGS. 2C-2D, an angle between the sidewall of the hole 108 and the surface 100*b* is increased from an angle θ1 to an angle θ2.

Figure 2E:
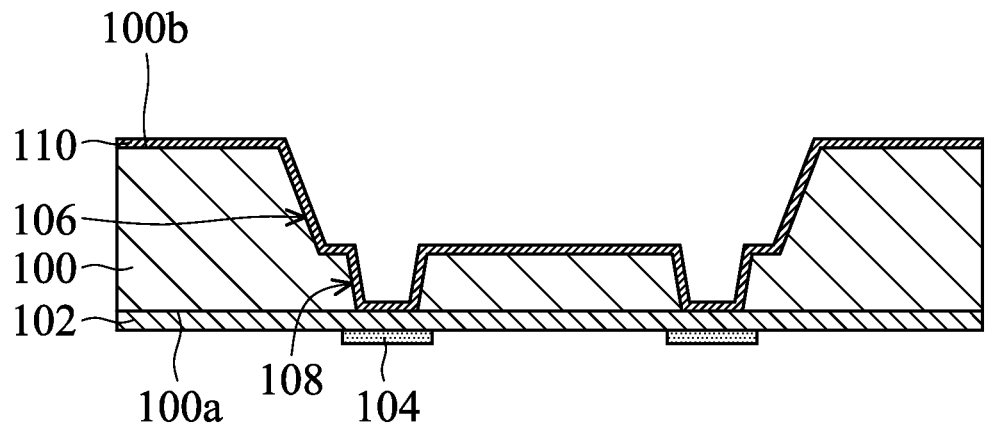

As shown in FIG. 2E, an insulating layer 110 may be conformally formed on the surface 100*b* of the substrate 100. In this embodiment, a through-hole extending from the surface 100*b* towards the surface 100*a* of the substrate 100 is together constructed by the recess 106 and the hole 108, thus the through-hole has a smaller aspect ratio which helps for the deposition of the insulating layer 110. In one embodiment, the insulating layer 110 covers the dielectric layer 102 and the conducting pads 104 thereunder.

Figure 2F:
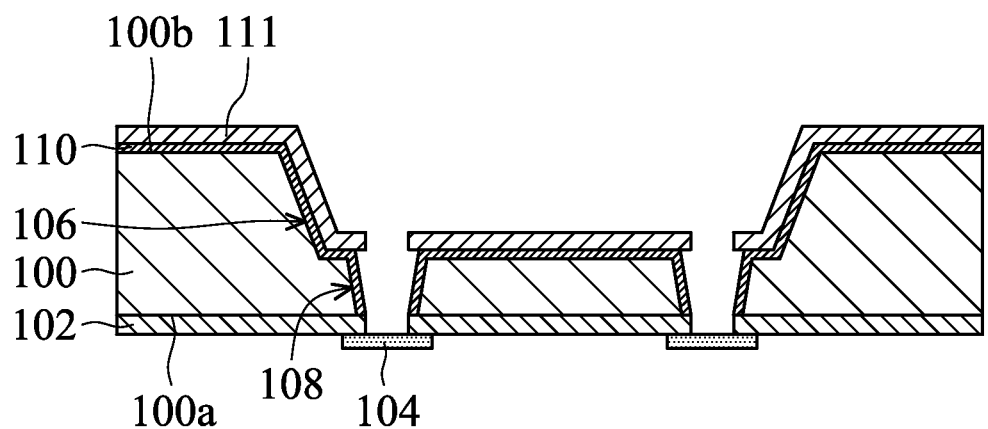

Next, as shown in FIG. 2F, a mask layer 111 is disposed on the surface 100*b* of the substrate 100. The mask layer 111 has an opening exposing the insulating layer 110 on the bottom of the hole 108. Then, the mask layer 111 may be used as a mask, and an etching process may be performed to remove the insulating layer 110 on the bottom of the hole 108 such that the conducting pad 104 is exposed. In one embodiment, a single etching process may be performed to remove the insulating layer 110 on the bottom of the hole 108 and the dielectric layer 102 thereunder such that the conducting pad 104 is exposed. Then, the mask layer 111 may be removed.

Figure 2G:
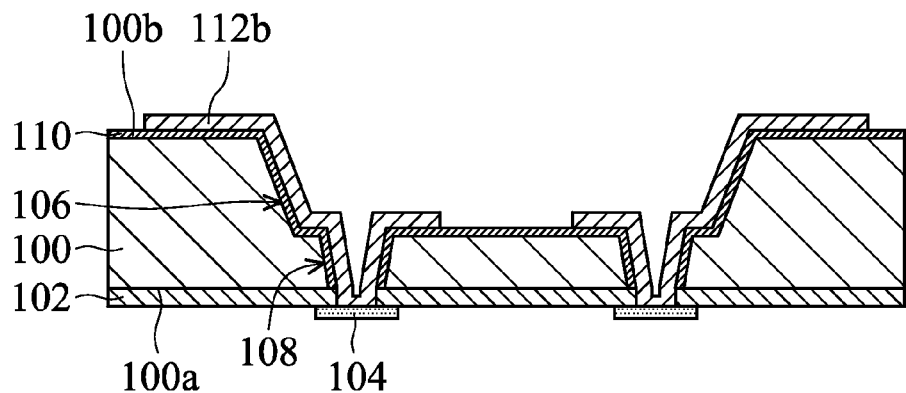

As shown in FIG. 2G, a patterned conducting layer 112*b* may be formed on the surface 100*b* of the substrate 100. In this embodiment, the through-hole extending from the surface 100*b* towards the surface 100*a* of the substrate 100 is together constructed by the recess 106 and the hole 108, thus the through-hole has a smaller aspect ratio which helps for the deposition of the conducting layer 112*b*. The conducting layer 112*b* may extend onto the sidewall and the bottom of the recess 106 and further extend onto the sidewall and the bottom of the hole 108 to electrically contact with the conducting pad 104. The conducting layer 112*b* may be formed by (but is not limited to) a method similar to that illustrated in FIGS. 1G-1I.

Figure 2H:
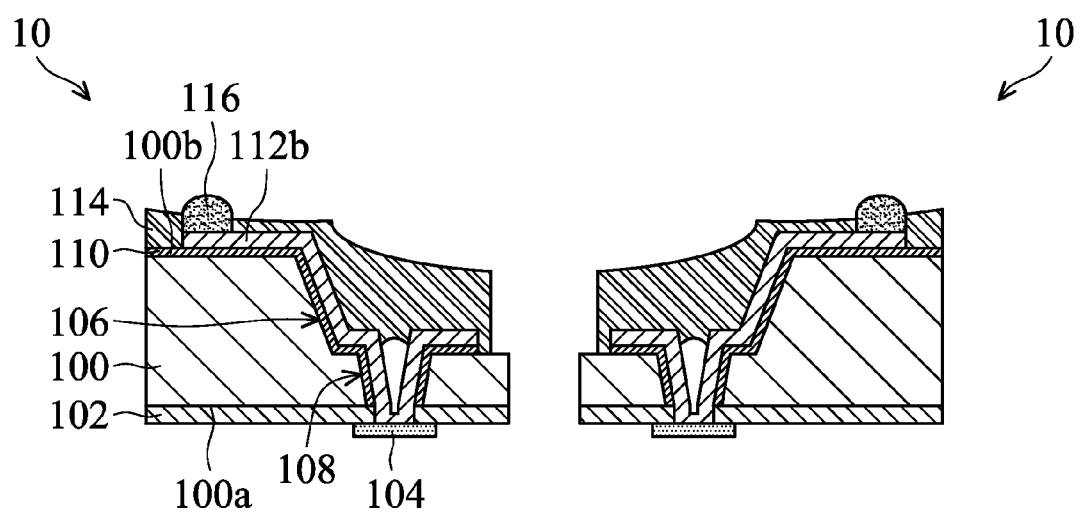

Next, as shown in FIG. 2H, a patterned protection layer 114 is formed on the surface 100*b* of the substrate 100. The protection layer 114 has at least an opening exposing the conducting layer 112*b* thereunder. In one embodiment, the protection layer 114 extends into the recess 106. In one embodiment, the protection layer 114 extends into the hole 108. In one embodiment, the protection layer 114 in the recess 106 has a trench which substantially overlaps with the predetermined scribe line SC of the substrate 100. Next, a conducting bump 116 is formed in the opening of the protection layer 114, which exposes the conducting layer 112*b*. Then, the substrate 100 is diced along the predetermined scribe lines SC of the substrate 100 to form at least an individual chip package 10. Because the protection layer 114 has a trench located at the scribe line, the protection layer 114 is not cut during the dicing process. Thus, the quality of the chip package may be improved. In this case, a sidewall of the protection layer 114 is not coplanar with a sidewall of the substrate 100.

Embodiments of the invention may have many variations. For example, referring to FIG. 3, an embodiment similar to the embodiment shown in FIG. 2 is illustrated. The main difference is that the embodiment shown in FIG. 3 includes a spacer layer (DAM) 302 disposed on the lower surface of the substrate and a substrate disposed on the spacer layer, which is, for example, a glass substrate (Glass) 304. In addition, the hole 108 further penetrates through the conducting pad 104 and extends into the spacer layer 302. Thus, the formed conducting layer 112*b* also extends into the spacer layer 302.

Figure 3:
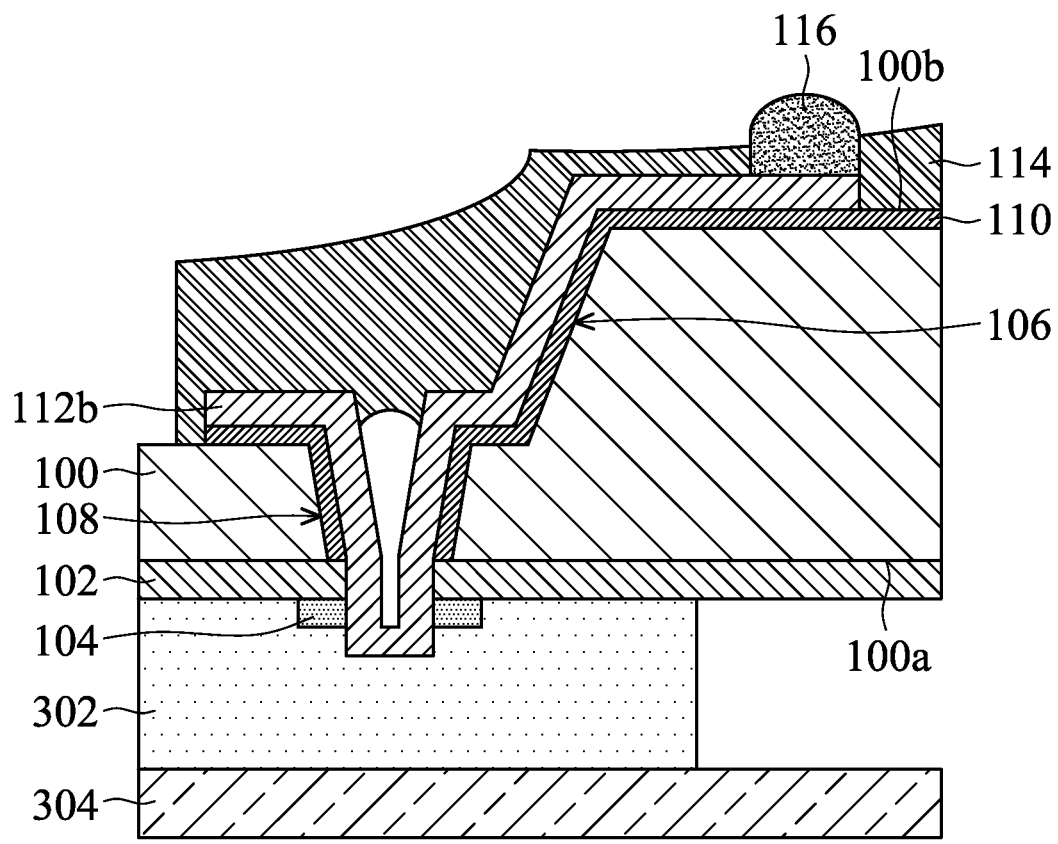
FIG. 3 is a cross-sectional view showing a chip package according to an embodiment of the present invention.
Figure 4:
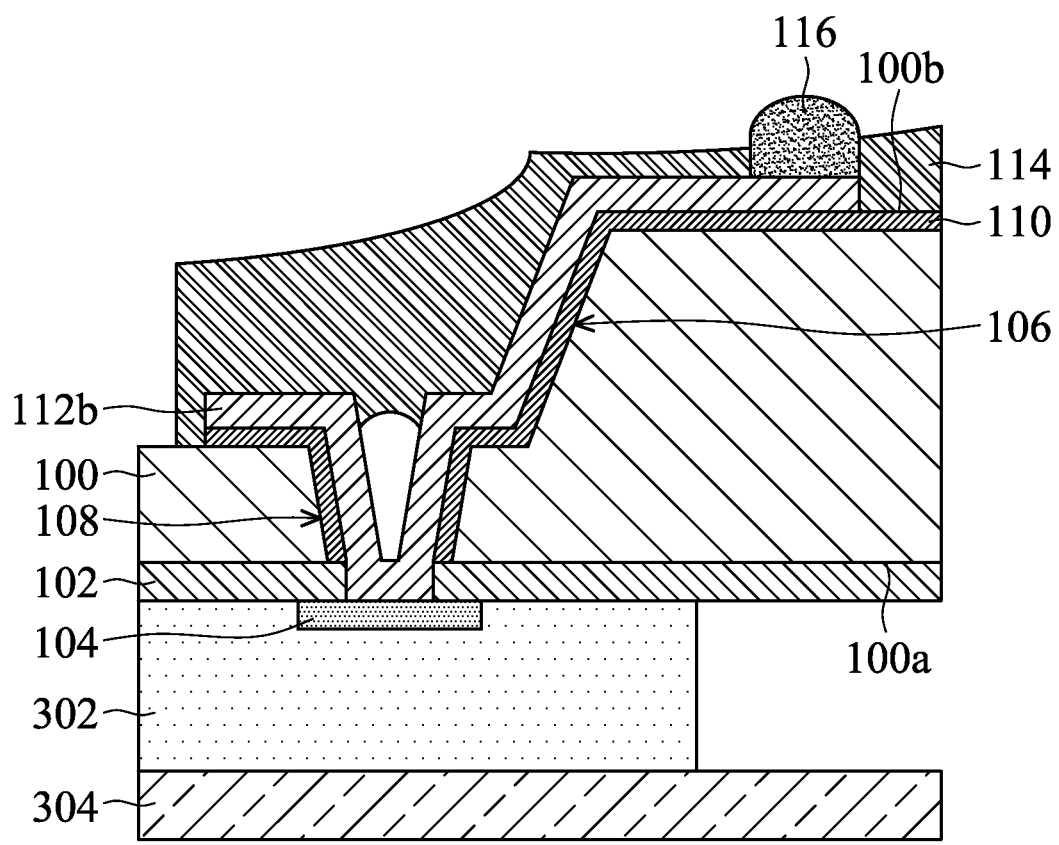
FIG. 4 is a cross-sectional view showing a chip package according to an embodiment of the present invention.

FIG. 4 shows another embodiment which is similar to the embodiment shown in FIG. 3. The main difference is that the hole 108 only reaches a surface of the spacer layer (DAM) 302 to expose the conducting pad 104. Thus, the conducting layer 112*b* also only reaches the surface of the spacer layer 302 without extending into the spacer layer 302.

In addition, it should be appreciated that the feature that the hole reaches the spacer layer or extends into the spacer layer illustrated in FIGS. 3 and 4 may also be applied to the embodiment shown in FIG. 1.

In the embodiments of the invention, the through-hole extending from the surface 100*b* towards the surface 100*a* of the substrate 100 is together constructed by the recess 106 and the hole 108. Thus, the through-hole has a smaller aspect ratio, which helps for the subsequent deposition of the material layer. Thus, a desired conducting route may be formed, given a limited space, and the quality of the formed conducting route may be maintained.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a chip package, comprising:
providing a substrate having a first surface and a second surface, wherein at least two conducting pads are disposed on the first surface of the substrate;
forming at least two holes in the substrate and extending from the second surface towards the first surface, wherein the holes respectively and correspondingly align with one of the conducting pads;
after the holes are formed, forming a recess in the substrate and extending from the second surface towards the first surface, wherein the recess overlaps with the holes;
forming an insulating layer on a sidewall and a bottom of the recess and on sidewalls of the holes;
forming a conducting layer on the insulating layer, wherein the insulating layer remains at least on the sidewalls of the recess and the holes in the chip package as finally formed, and wherein the conducting layer is formed on the insulating layer that remains on the sidewalls of the hole and electrically contacts with one of the conducting pads;

forming a protection layer on the second surface of the substrate, extending into the recess without extending into the holes overlapping the recess, wherein the protection layer in the recess is patterned with an opening along a predetermined scribe line prior to dicing; and dicing the substrate through the opening along the predetermined scribe line to form at least a chip package.

2. The method for forming a chip package as claimed in claim 1, further comprising forming one or more contact openings in the protection layer exposing the conducting layer outside the recess; and forming a conducting bump in the one or more contact openings of the protection layer.

3. The method for forming a chip package as claimed in claim 1, wherein the predetermined scribe line is located between two of the holes.

4. The method for forming a chip package as claimed in claim 1, wherein the opening in the protection layer forms a trench overlapping with the predetermined scribe line.

5. The method for forming a chip package as claimed in claim 1, wherein after the holes are formed and before the recess is formed, a first angle is between a sidewall of one of the holes and the second surface, and after the recess is formed, a second angle larger than the first angle is between the sidewall of one of the holes and the second surface.

6. The method for forming a chip package as claimed in claim 1, further comprising dicing the substrate along a predetermined scribe line of the substrate to form at least a chip package.

7. The method for forming a chip package as claimed in claim 6, wherein the predetermined scribe line is located between two of the holes.

8. The method for forming a chip package as claimed in claim 1, wherein the recess and the holes connect with each other.

9. The method for forming a chip package as claimed in claim 1, wherein projections of the holes overlap with a projection of the recess on the first surface of the substrate.

10. The method for forming a chip package as claimed in claim 1, wherein the recess overlaps with multiple holes.

11. The method for forming a chip package as claimed in claim 1, wherein dicing of the substrate is performed through the opening, without cutting the protection layer.

12. The method for forming a chip package as claimed in claim 11, wherein the protection layer has a sidewall defining the opening, wherein dicing forms a sidewall of the substrate along the predetermined scribe line, and wherein the sidewall of the protection layer is not coplanar with the sidewall of the substrate.

13. The method for forming a chip package as claimed in claim 1, wherein the opening in the protection layer forms a trench overlapping with the predetermined scribe line, and wherein dicing of the substrate is performed through the trench, without cutting the protection layer.

14. The method for forming a chip package as claimed in claim 13, wherein the trench has a sidewall, wherein dicing forms a sidewall of the substrate along the predetermined scribe line, and wherein the sidewall of the trench is not coplanar with the sidewall of the substrate.

15. The method for forming a chip package as claimed in claim 1, wherein the edge of the insulating layer at the bottom of the recess is spaced apart from the opening in the protection layer.

16. The method for forming a chip package as claimed in claim 2, wherein the conducting bump is a solder bump.

17. The method for forming a chip package as claimed in claim 1, wherein the substrate is a semiconductor substrate.

18. The method for forming a chip package as claimed in claim 1, wherein the recess is formed with the bottom of the recess closer to the first surface than to the second surface of the substrate.

19. The method for forming a chip package as claimed in claim 1, wherein a void is formed below the protection layer in each of the holes overlapping the recess.

20. The method for forming a chip package as claimed in claim 19, wherein the void is not filled with any solid material.

* * * * *